United States Patent [19]

Crook et al.

[11] Patent Number: 5,557,209
[45] Date of Patent: * Sep. 17, 1996

[54] IDENTIFICATION OF PIN-OPEN FAULTS BY CAPACITIVE COUPLING THROUGH THE INTEGRATED CIRCUIT PACKAGE

[75] Inventors: David T. Crook; Kevin W. Keirn, both of Loveland, Colo.; Ugur Cilingiroglu, Istanbul, Turkey

[73] Assignee: Hewlett-Packard Company, Palo Alto, Calif.

[*] Notice: The term of this patent shall not extend beyond the expiration date of Pat. No. 5,254,953.

[21] Appl. No.: 400,787

[22] Filed: Mar. 7, 1995

Related U.S. Application Data

[63] Continuation of Ser. No. 127,400, Sep. 27, 1993, abandoned, which is a continuation of Ser. No. 892,868, Jun. 3, 1992, Pat. No. 5,254,953, which is a continuation-in-part of Ser. No. 631,609, Dec. 20, 1990, Pat. No. 5,124,660.

[51] Int. Cl.$^6$ ........................................... G01R 31/02
[52] U.S. Cl. ........................... 324/537; 324/538; 324/686
[58] Field of Search .................................. 324/537, 538, 324/540, 555, 658, 686, 718, 750, 758, 765

[56] References Cited

U.S. PATENT DOCUMENTS

| | | | |
|---|---|---|---|
| 3,798,541 | 3/1974 | Campbell, Jr. et al. | 324/72.5 |
| 3,975,680 | 8/1976 | Webb | 324/61 P |
| 4,055,801 | 10/1977 | Pike et al. | 324/73 R |
| 4,056,773 | 11/1977 | Sullivan | 324/500 |
| 4,114,093 | 9/1978 | Long | 324/73 AT |
| 4,186,338 | 1/1980 | Fichtenbaum | 324/521 |
| 4,520,318 | 5/1985 | Hascal et al. | 324/457 |
| 4,565,966 | 1/1986 | Burr et al. | 324/73 PC |
| 4,583,042 | 4/1986 | Riemer | 324/73 PC |
| 4,620,304 | 10/1986 | Faran, Jr. et al. | 371/20 |
| 4,695,788 | 9/1987 | Marshall | 324/527 |
| 4,779,041 | 10/1988 | Williamson, Jr. | 324/537 |
| 4,789,829 | 12/1988 | Stribling | 324/263 |
| 4,801,866 | 1/1989 | Wixley | 324/73 PC |
| 4,801,878 | 1/1989 | Peiffer et al. | 324/158 T |

(List continued on next page.)

FOREIGN PATENT DOCUMENTS

| | | |
|---|---|---|
| 0177210 | 4/1986 | European Pat. Off. . |
| 0317440 | 5/1989 | European Pat. Off. . |
| 2101335 | 3/1972 | France . |
| 2143954 | 2/1985 | United Kingdom . |
| 2179751 | 3/1987 | United Kingdom . |

OTHER PUBLICATIONS

McDermid, John E., "Reducing Errors in Automated analog In-Circuit Test Program Generation", *Hewlett-Packard Journal*, Oct. 1984, pp. 31-36.

GenRad, Inc., *Introduction to In-Circuit Testing*, Jan. 1984, pp. 34-41, 62-63.

Lancaster, L. M., "Coaxial Circuit Probe," *IBM Technical Disclosure Bulletin*, vol. 12, No. 10 p. 1644 (Mar. 1970).

"Test Programming, 227X Board Test Workstations", (Release 8.1.1), pp. 1-2— 1-7, GenRad, Inc. (1985).

"227X/2282 Tips and Hints", *GenRad Software Support Program, Technical Newsletter*, vol. 3, No. 1, pp. 1-3, (Spring 1989).

"Sales Brochure", QA Technology Co., Inc., pp. 1-28 (1990).

(List continued on next page.)

*Primary Examiner*—Kenneth A. Wieder
*Assistant Examiner*—Glenn W. Brown

[57] ABSTRACT

Disclosed is a system that determines whether input and output pins of semiconductor components are present and properly soldered to a printed circuit board. The system uses an oscillator which supplies a signal, typically ten kilohertz (10 kHz) at 0.2 volts, to the pin under test. A conductive electrode is placed on top of the component package. The electrode is connected to a current measuring device. Another pin of the component is connected to the common signal return. Typically the other pin is chosen to be a power or ground pin of the component.

19 Claims, 9 Drawing Sheets

U.S. PATENT DOCUMENTS

| | | | |
|---|---|---|---|
| 4,894,605 | 1/1990 | Ringleb et al. | 324/537 |
| 4,896,108 | 1/1990 | Lynch et al. | 324/158 T |
| 4,918,376 | 4/1990 | Poduje et al. | 324/663 |
| 4,928,057 | 5/1990 | Williams | 324/72 |
| 5,006,808 | 4/1991 | Watts | 324/537 |
| 5,075,621 | 12/1991 | Hoyt | 324/158 P |
| 5,081,421 | 1/1992 | Miller et al. | 324/671 |
| 5,101,152 | 3/1992 | Harwood et al. | 324/158 R |
| 5,111,137 | 5/1992 | Heumann et al. | 324/158 R |
| 5,124,660 | 6/1992 | Cilingiroglu | 324/538 |
| 5,132,607 | 6/1992 | Shah et al. | 324/72.5 |
| 5,138,266 | 8/1992 | Stearns | 324/537 |
| 5,187,430 | 2/1993 | Marek et al. | 324/66 |
| 5,202,640 | 4/1993 | Schaaf et al. | 324/158 F |
| 5,254,953 | 10/1993 | Crook et al. | 324/538 |
| 5,391,993 | 2/1995 | Khazam et al. | 324/684 |
| 5,420,500 | 5/1995 | Kerschner | 324/72.5 |
| 5,468,753 | 11/1996 | Khazam et al. | 324/72.5 |
| 5,469,064 | 11/1995 | Kerschner et al. | 324/537 |

OTHER PUBLICATIONS

European Patent Application No. 91 310 861.9, Office Action Dated Dec. 15, 1994.

European Patent Application No. 91 310 861.9, Search Report (Aug. 20, 1992).

Crook, D., "A Fourth Generation Analog Incircuit Program Generator," *International Test Conference Paper 28.3* pp. 605–612 (1990).

*Introduction to Multi–Strategy Testing*, GenRad, Inc., pp. 3–11 —3–16 (1989).

Test Set Preparation 227X Board Test Workstations, GenRad, Inc., pp. 1–21 —1–27 (1988).

*Introduction to In–Circuit Testing*, GenRad, Inc., p. 122 (3d. Ed. 1985).

*Introduction to In–Circuit Testing*, GenRad, Inc., pp. 34–37 (2d Ed. 1984).

"Introduction to Guarding," *Analog In–Circuit Measurement System Option M809/M766 Application Handbook*, Teradyne, Inc., pp. 13–22 (1983).

Crook, D., "Analog In–Circuit Component Measurements: Problems and Solutions," *Hewlett–Packard Journal*, pp. 19–22 (Mar. 1979).

Hall, H. P. et al., "The Use of Active Devices In Precision Bridges," *Electrical Engineering*, 81(5): pp. 367–372 (May 1962).

HP 3065X/L Users' Manual vol. 1: System Reference, Hewlett–Packard Company, pp. 20–1—20–34 (1986).

HP 3070 Users' Manual Test Methods: Shorts and Analog, Hewlett–Packard Company, pp. 2–1—2–24 (1989).

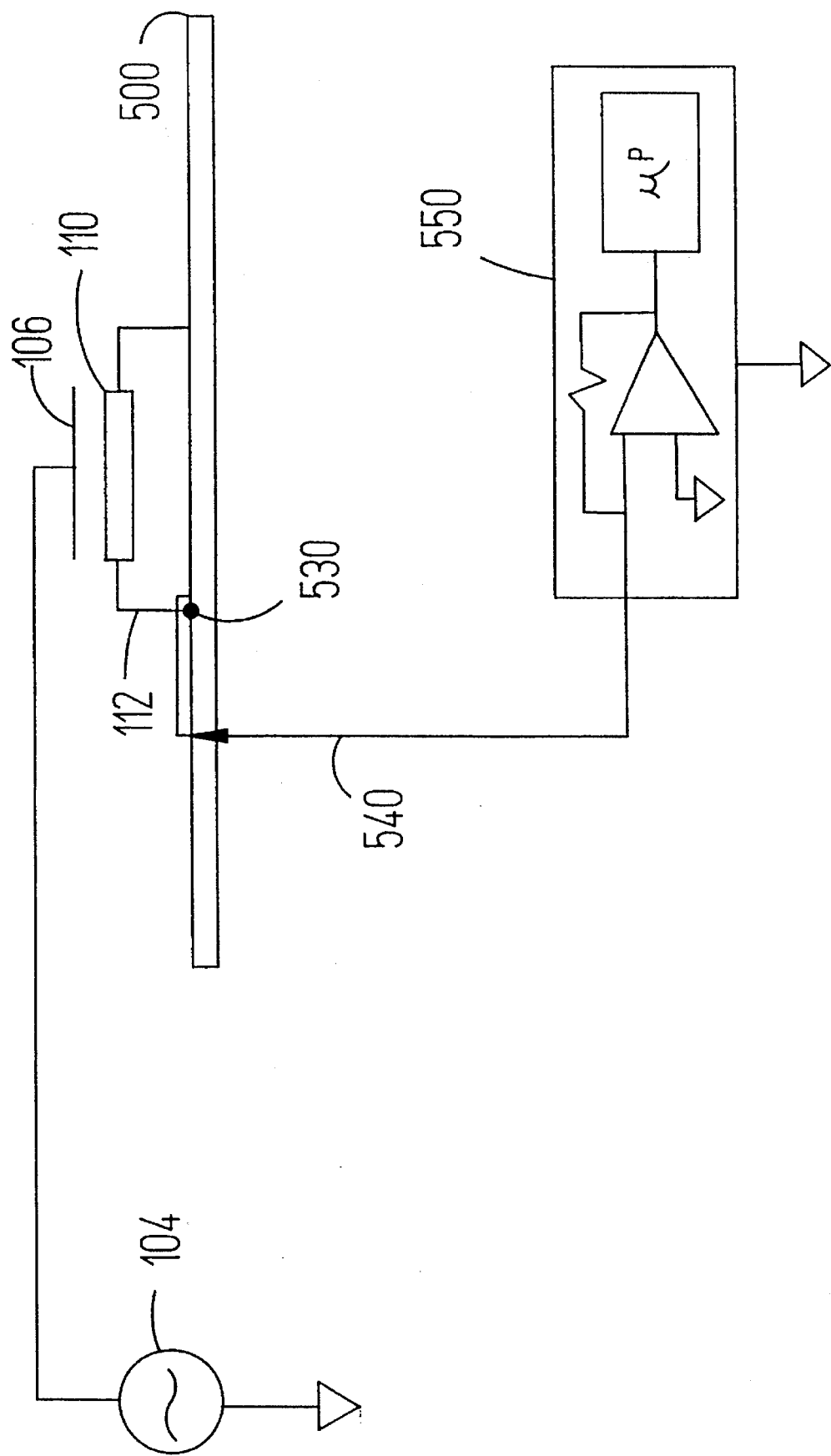

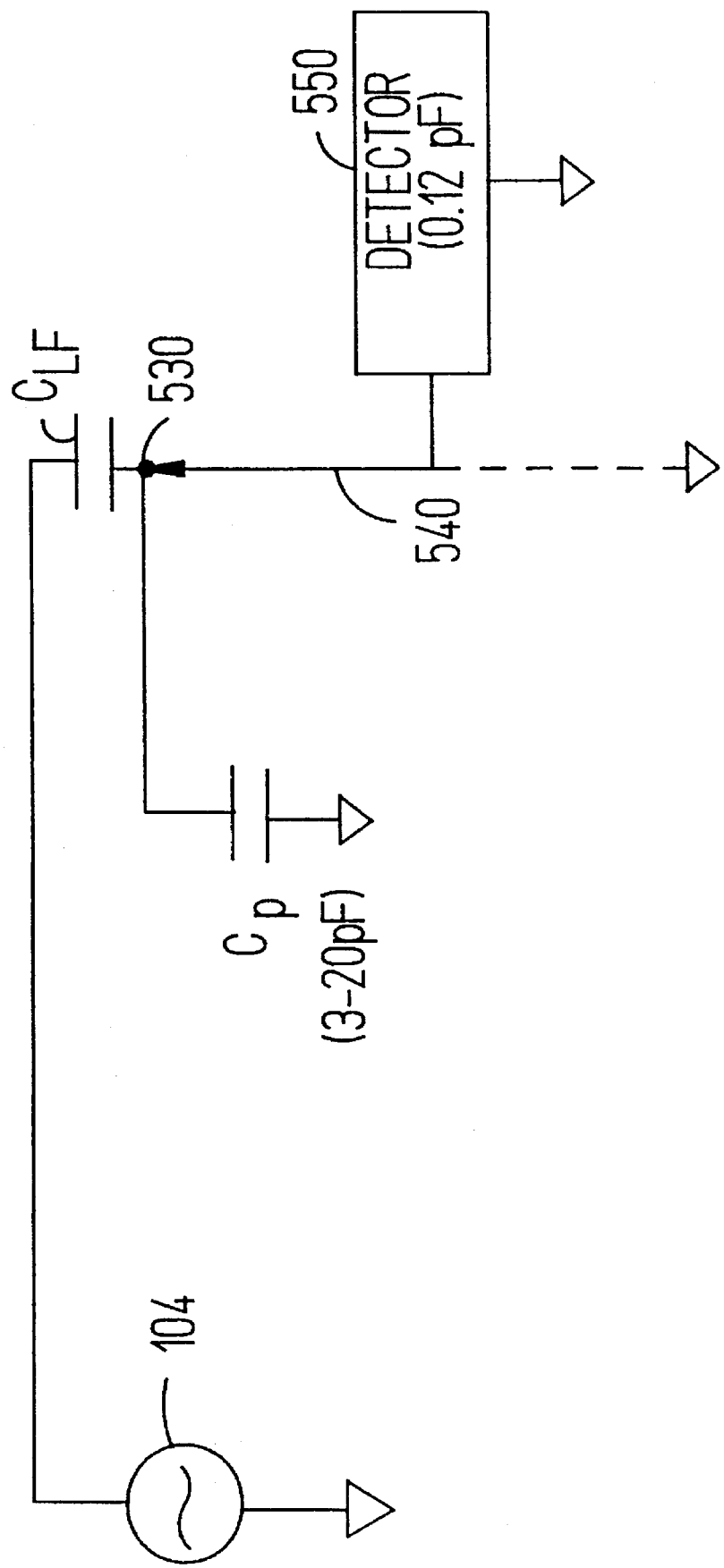

IDENTIFICATION OF PIN-OPEN FAULTS BY CAPACITIVE COUPLING THROUGH THE INTEGRATED CIRCUIT PACKAGE

This is a continuation of application Ser. No. 08/127,400, filed Sep. 27, 1993 (abandoned), which is a continuation of application Ser. No. 07/892,868, filed Jun. 03, 1992 (U.S. Pat. No. 5,254,953) which is a continuation-in-part of application Ser. No. 07/631,609, filed Dec. 20, 1990 (U.S. Pat. No. 5,124,660).

FIELD OF THE INVENTION

This invention generally relates to measuring and testing devices and more particularly relates to in-circuit testing devices. Still more particularly, the invention relates predominantly to in-circuit testing of connections between integrated circuits or other components and a circuit assembly.

BACKGROUND OF THE INVENTION

In this specification, the terms circuit assembly and printed circuit board will be considered interchangeable. The term circuit assembly includes printed circuit boards as well as other types of circuit assemblies. A circuit assembly is a combination of electrical and electronic components and the electrical conductors that connect those components. The resulting combination is manufactured to form a physical or functional unit. In this discussion the term trace is used to describe these connecting electrical conductors, particularly on a printed circuit board. The term node includes the electrical connections comprising such a conductively connected path, including the connection pins of the components. Generally, the term node does not include circuitry inside of the components that is not conductively connected to the terminal connections of said components.

In this specification, the term integrated circuit is used to describe a class of components attached to a circuit assembly. This term is not used to limit the application of the disclosed invention to integrated circuits. The current state of the art is such that a major contribution of this invention is in testing components which are integrated circuits.

It is important that electronic components and printed circuit boards be tested after the components have been soldered to the printed circuit boards. Several different approaches have been developed for testing the components and printed circuit boards, including functional testing, in-circuit testing, and manufacturing defect analysis.

Functional testing uses a procedure of applying predetermined input signals and monitoring the output of a printed circuit board to determine if all of the components are present and operating properly on the circuit board. While functional testing provides a way of determining whether the printed circuit board is functioning properly, it provides little or no information regarding the functioning of individual components on the board. Complex programming techniques have been used to provide limited information as to the location of non-functioning components on the board by carefully selecting input data and analyzing the output results. Such systems are complex, often costly to implement, and normally provide only vague information as to the location of malfunctioning components.

Because of the limitations of functional testing, in-circuit testing techniques have been used to individually test the components on the printed circuit board to determine if these components are installed and working properly. This process uses a "bed of nails" fixture to access each individual component and test that component individually. In this manner, non-functioning components can be identified and replaced to prevent the entire circuit board from being scrapped. This process works well for simple components where the circuit inside the component is known and can be easily tested. If the component being tested is very complex, or if the circuit inside the component is unknown, in-circuit testing may not achieve satisfactory results.

Manufacturing defect analyzers are another class of testing devices that provide simpler tests and are less expensive to implement. These devices are designed to locate manufacturing faults, such as shorts on a printed circuit board, missing integrated circuits, bent component pins, etc. Although these devices do a reasonably good job of finding shorts and gross analog faults, they are marginally satisfactory for testing digital sections of the board.

One very important requirement that must be addressed for every printed circuit board is that all the pins of every component must be soldered to the circuit board. Functional testing may miss a particular pin if the functions performed by that particular pin are not thoroughly tested in the functional test. Testing for this type of fault is particularly difficult when the circuit inside the component is unknown, such as the case with application specific integrated circuits (ASICs). Because of the large number of ASICs and the complexity of these devices, it is often not feasible, for reasons of time or cost, to design an in-circuit test or a functional test to isolate a fault on this type of component.

Prior art in the area of connection verification by capacitive connection includes UK Patent GB 2143954A, by Michael Rignall. Rignall cites one of the main reasons for capacitive coupling in verifying networks of a circuit assembly or printed circuit board as being the lack of the need of an ohmic contact. It is recognized that ohmic contact probes are susceptible to contamination on the contacting surfaces. This contamination can cause improper test decisions to be made such that an open is diagnosed as being in the circuit under test when, in reality, the test contact is faulty and the circuit is not faulty. Rignall teaches that the connectivity of a conductive connection, isolated from other circuitry, can be verified by capacitive coupling to extreme ends of a conductive trace on the circuit assembly. Rignall teaches that such capacitive coupling allows the test to be made without a contacting connection to the trace.

SUMMARY OF THE INVENTION

Accordingly, a primary object of the present invention is to provide improved apparatus and methods for testing the integrity of a connection between a pin of an electrical component and a printed circuit board, or circuit assembly.

Systems in accordance with the present invention determine whether connection pins of a component of the assembly are properly connected to the circuit assembly. According to the present invention, a system for measuring the integrity of an electrical contact between a connection pin of an electrical component and an electrical circuit assembly comprises signal supplying means for supplying an electrical signal; measuring means for measuring a parameter indicative of a capacitance associated with the connection of the connector pin of the component to the circuit assembly; a conductive electrode, connected to the measuring means, comprising a surface adapted to be placed in proximity to a surface of the connection pin; an electrical connection from the output of the signal supplying means to the connection pin being tested; and an electrical connection between at least one other node of the circuit assembly and the common signal return of the signal supplying means.

Preferred embodiments of the present invention further comprise error indicating means for indicating an error condition whenever the said parameter is not within predetermined limits. A measurement lower than the low limit indicates an open pin. Measurements exceeding the high limit are indicative of other faults, such as an open ground or power pin on the component.

The measuring means may advantageously comprise means for measuring an electrical current or voltage between the conductive electrode and the common signal return of the signal supplying means, these options representing preferred embodiments of the invention. Alternatively, the connections to the signal supplying means and the measuring means may be interchanged. Such an interchanged configuration is useful when the impedances paralleling the measuring means are known to be high enough to not adversely affect the repeatability of the measurement. These impedances are comprised of both impedances on the circuit assembly and impedances in the measurement system.

The current measuring means in other embodiments of the invention also comprises means for holding the current measurement connection to a virtual ground. This virtual ground may be implemented with conventional operational amplifier circuitry.

In addition, a computing means may be operatively coupled to the measuring means to compute the effective capacitance and determine when the measured parameter falls outside predetermined limits such that a determination is made that the pin being tested is diagnosed as being open. In other embodiments, the computing means may make such a determination based on the units of the measurement without converting to units of capacitance.

The conductive electrode is effective if it is near the conductive circuit of the component lead being tested. This includes both the actual exposed conductive lead material as well as conductive lead material separated from the conductive electrode by insulating material in the component. Since the insulating material has a dielectric constant higher than that of air, the measured response is higher than if the insulating material had been replaced by an air gap of the same separation.

Preferred embodiments of the invention use a metallic electrode, such as copper foil, placed on top of a non-conducting component package. A connection is then made, through a bed of nails fixture, to a printed circuit board wiring trace that connects to the component pin being tested. This connection is in turn connected to an oscillator (signal supplying means). The foil electrode in one embodiment of the invention is connected to an ac current measuring means. The oscillator is set to apply a voltage to the component pin being tested. The oscillator is typically set to 0.2 volts RMS amplitude and a frequency near 10 kilo Hertz (Khz). At least one other node of the circuit assembly is connected to the common signal return of the oscillator. Typically the pin of the component which is attached to the circuit assembly ground plane is among the pins chosen to be connected to the common signal return of the oscillator. Often, all nodes of the assembly, other than the node that includes the pin being tested, are connected to the common signal return of the oscillator.

Because the metallic electrode typically covers the entire component, it also capacitively coupled to all other pins on the package. This structure forms capacitors between each of the component pins and the conductive electrode. The component also exhibits capacitance between each pair of pins of the component. This capacitance is formed both by the capacitance between the leads of the pins as well as internal capacitances inside the die of integrated circuits. Additional capacitances are found between pairs of printed circuit traces that are attached to the component being tested. Additional capacitances are typically found from each printed circuit board to the ground planes of the printed circuit board. These capacitances are typically on the order of 10 pico Farads (10 pF). In some cases they may range from 1 or 2 pF to as high as 100 pF.

The effects of these intrinsic capacitances is best examined by circuit modeling and analysis. FIG. 7 shows a circuit model for analyzing the performance of the preferred embodiment when these intrinsic capacitances are assumed. In this model, the current measuring means is composed of an AC voltmeter measuring the voltage across a resistor. This example employs a component (integrated circuit) with four connection pins. One of the four pins is connected to the circuit assembly ground plane. It is assumed that the capacitance from each of the connection pins to the conductive electrode is 0.040 pico Farads (0.040 pF). It is also assumed that the intrinsic capacitances discussed above are ten pico Farads (10 pF). The signal supplying means is assumed to be set to 0.2 Volt RMS and a frequency of 10 kilo Hertz (10 kHz). The capacitance being measured is assumed to be that value of capacitance which could replace the entire capacitive network, that is the capacitance which would be connected directly between the signal supplying means and the current measuring means. The solution of this problem could be attained by solving equations manually. However the solutions presented here were attained by use of commonly available network analysis programs for digital computers. The circuit was analyzed under six conditions. Three conditions reflect three measurement configurations discussed herein. For each of these measurement configurations, two circuit assembly conditions are examined: one with all pins soldered; the other with one of the pins having an open connection.

The first configuration represents the case of the prior art (Rignall), where a means for connecting at least one other pin to the common signal return is not provided.

The second configuration represents improvements afforded by connecting the ground connection of the component to the common signal return.

The third configuration represents improvements afforded when all nodes of the assembly, other than the node comprising the pin being tested, are connected to the common signal return.

The following table represents the results of the analysis:

| | Effective Equivalent Capacitance | |
|---|---|---|
| Configuration | Tested Pin Connected | Tested Pin Open |
| No other pins connected to common signal return | 0.1598 pF | 0.1591 pF |
| A ground pin connected to common signal return | 0.0800 pF | 0.0319 pF |
| All other pins | 0.0400 pF | 0.0001 pF |

-continued

Effective Equivalent Capacitance

| Configuration | Tested Pin Connected | Tested Pin Open |
|---|---|---|
| connected to common signal return | | |

From the table it is clear that, without at least one other pin connected to the common signal return, the difference between an open and a short can not be dependably measured. Not only is the difference (0.0007 pF) lower in capacitance than can be readily measured in reasonable time, but the unit-to-unit variations in intrinsic capacitances would be many times this difference.

The second configuration shows a condition which has over 0.040 pF variation between open and short. This is readily measured in reasonable time. The residual measurement, with the tested pin open, is less than half the measurement with the pin connected. This means that unit-to-unit variations will be smaller than the change due to an open. This is a requirement for a reliable test.

The third configuration shows the case where all other pins are connected to the common signal return. Not only does the connected pin read virtually as expected, but the residual with the pin open is almost zero.

The modeling results clearly illustrate the strengths of the invention herein described. The results of the analysis closely agree with actual measurements on printed circuit boards. It is also clear that power and ground planes and nodes provide a propagation means for undesired capacitive effects. In the present invention, these undesired effects are reduced by attachment of other circuit assembly nodes to the common signal return lead of the signal supplying means.

Alternatively, the invention can be implemented with a voltage measuring means. In this case, current is still being measured, albeit indirectly. The voltage measured represents the current flow across a parallel impedance (often largely capacitive) formed mostly by uncontrolled stray capacitances. The variability of these stray capacitances is a major reason that this is not the preferred embodiment. Measurement with a current measuring means usually presents a low impedance that minimizes the error causing currents that flow through these stray capacitances.

Rignall's teachings in UK Patent GB 2143954A do not suggest applying his technique to verification of circuit assemblies already loaded with components. If one tries to apply Rignall's technique to the problem of open component lead connections, one quickly is faced with the large problem of stray capacitances supplied by both the printed circuit board and the internal capacitances of the component itself.

The present invention avoids the disadvantages of Rignall's approach by connecting those troublesome common power connections to the common signal return lead. The present invention also makes use of a low frequency signal (typically near 10 kilo Hertz). This choice of frequency allows a low impedance connection between the circuit assembly and the common signal return connection. Operation at higher frequencies, such as 10 mega Hertz, result in the inductance of the connection to the common signal return lead being much higher. This in turn leads to much greater problems of spurious responses and the accompanying lack of resolution necessary to conclusively diagnose open circuits on the component connections.

BRIEF DESCRIPTION OF THE DRAWINGS

FIG. 6A shows in a simplified manner the use of the present invention in checking a solder joint of a pin of an IC; FIGS. 6B and 6C depict electrical equivalent circuits for the case in which the solder joint is a "good" solder joint (FIG. 6B) and the case in which the solder joint is a "bad" solder joint (FIG. 6C).

DESCRIPTION OF THE PREFERRED EMBODIMENT

The following description is of the best presently contemplated mode of carrying out the present invention. This description is not to be taken in a limiting sense but is made merely for the purpose of describing the principles of the invention. The scope of the invention should be determined by referring to the appended claims.

Figure 1:
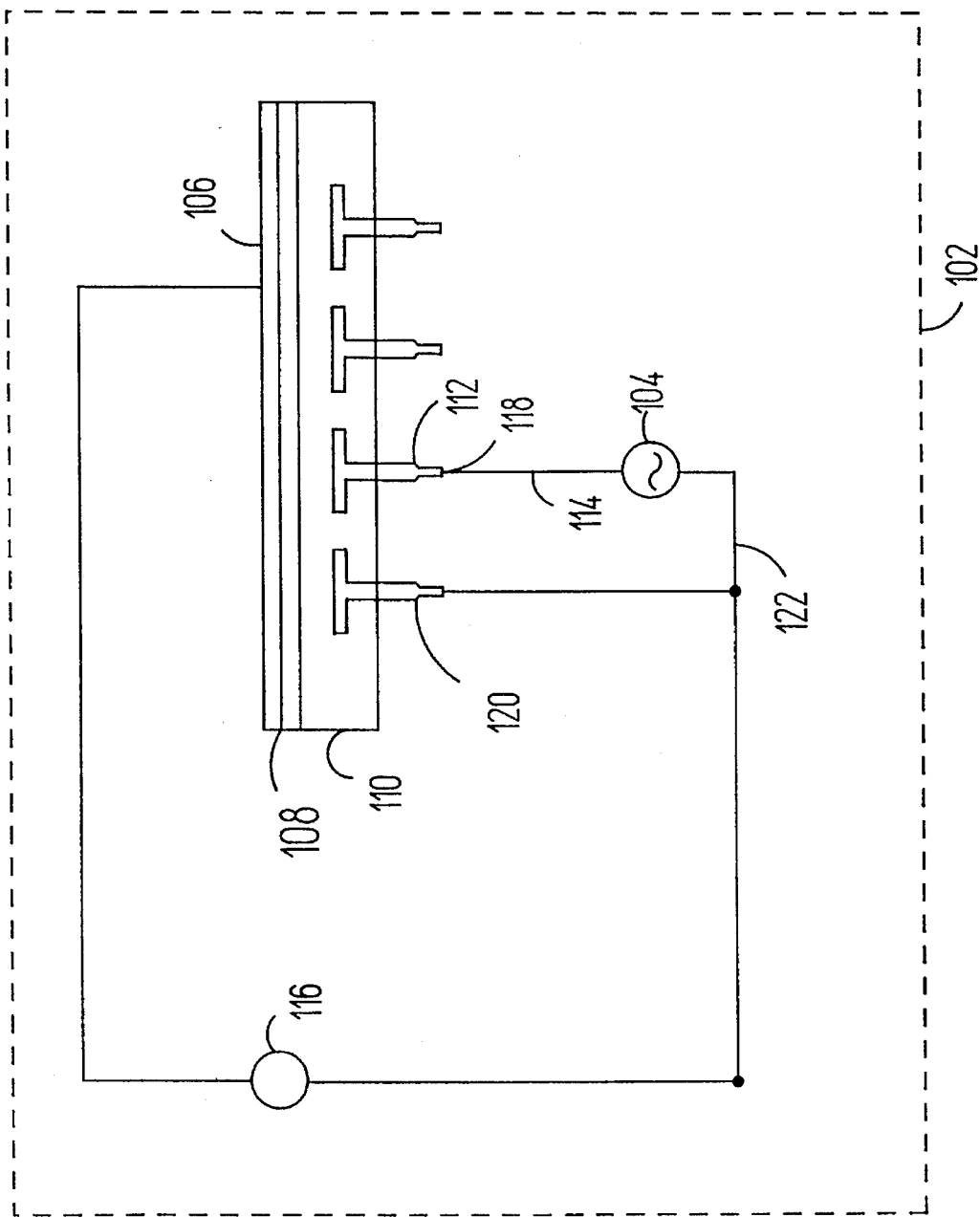
FIG. 1 shows a schematic diagram of a system in accordance with the present invention.

FIG. 1 shows a schematic diagram of one embodiment of the invention. Referring now to FIG. 1, the system of the present invention 102 uses an oscillator 104 which supplies an alternating current signal, typically ten kilohertz (10 kHz) at 0.2 volts. The output of the oscillator 104 is connected to the pin under test 112. A conductive electrode 106 is placed on top of the component package 110. An insulator 108 may be placed between the electrode 106 and the component package 110. The electrode is connected to a current measuring device, such as an ammeter, 116. Another pin 120 of the component is connected to the common signal return 122. Typically the other pin 120 is chosen to be a power or ground pin of the component 110. The other pin 120 is typically tied to a power or ground plane on the assembly.

When the test is performed, the oscillator voltage is applied to a trace 114 on the circuit assembly which should be attached to the pin being tested 112. The oscillator voltage then appears on the pin 112 of the component. Through capacitive coupling, a current is passed to the electrode 106 and then to the current measuring device 116. If the measured current falls between predetermined limits, then the pin 112 must be connected to the component 110 at location 118. If the pin 112 is not connected at location 118, no current will be conducted to the electrode 106 and no current will be measured by the ammeter 116, indicating that a pin open fault is present.

Alternatively, the connections to the signal means and the measuring means may be interchanged. In that case, when the test is performed, the oscillator 104 is activated and a current is conducted to the electrode 106. Through capacitive coupling, the current is passed to the pin 112 of the integrated circuit 110. The current then passes through a connection to a printed circuit board trace 114 and the current then passes to the ammeter 116 which measures the amount of current. If a threshold amount of current is measured by the ammeter 116, then the pin 112 must be connected to the integrated circuit trace 114 at location 118. If the pin 112 is not connected at location 118, no current will be conducted to the integrated circuit trace 114 and no current will be measured by the ammeter 116 indicating that a pin open fault is present.

Figure 2:
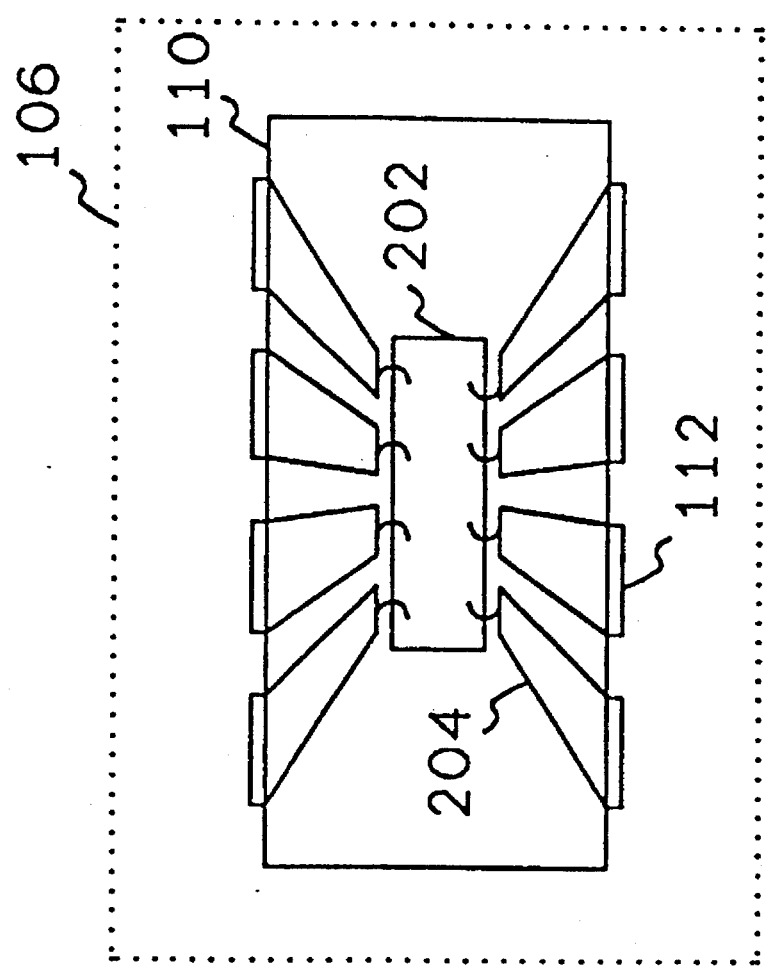
FIG. 2 shows a top cutaway view of an integrated circuit.
Figure 3:
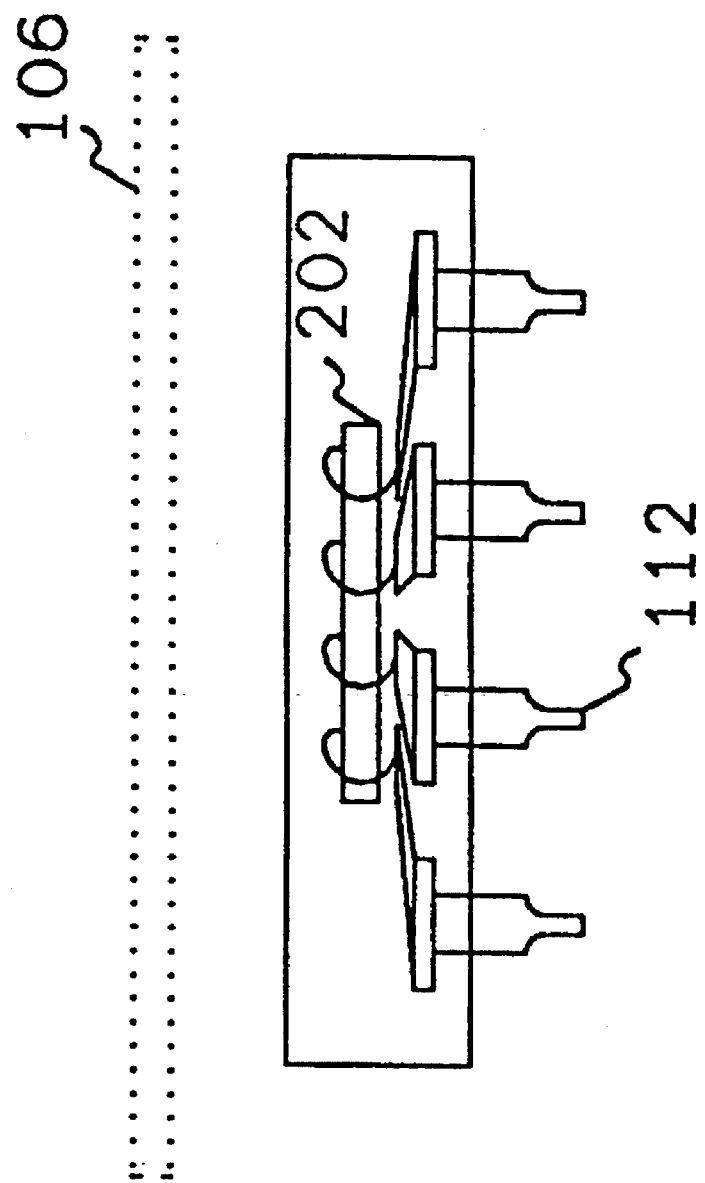
FIG. 3 shows a side cutaway view of an integrated circuit and illustrates, along with FIG. 2, how capacitive coupling occurs.

FIG. 2 shows a top cut away view of the integrated circuit component 110 and the electrode 106, and FIG. 3 shows a side cut away view of the integrated circuit component 110 and the electrode 106. FIGS. 2 and 3 illustrate how the capacitive coupling occurs between the electrode and the pins of the integrated circuit. Referring now to FIGS. 2 and 3, the integrated circuit package 110 contains an integrated circuit die 202. The integrated circuit 202 contains connections, however, these connections must be made to the outside of the integrated circuit package 110. Therefore, the pin 112 is connected to an internal conductor 204 which connects the pin 112 to a location just adjacent the integrated circuit 202. There, a small wire spans between the conductor 204 and a location on the integrated circuit 202. Similar connections are made to all the other pins of the integrated circuit package 110.

The conductor 204 forms a metallic plate, which acts as one plate of a capacitor. The other plate of the capacitor is the electrode 106, here illustrated by dashed lines, indicating that the conductor 106 is placed over the top of the integrated circuit package 110. Although the capacitor created in this manner is small, it is sufficient to conduct a signal between the electrode 106 and the pin 112.

Figure 4:
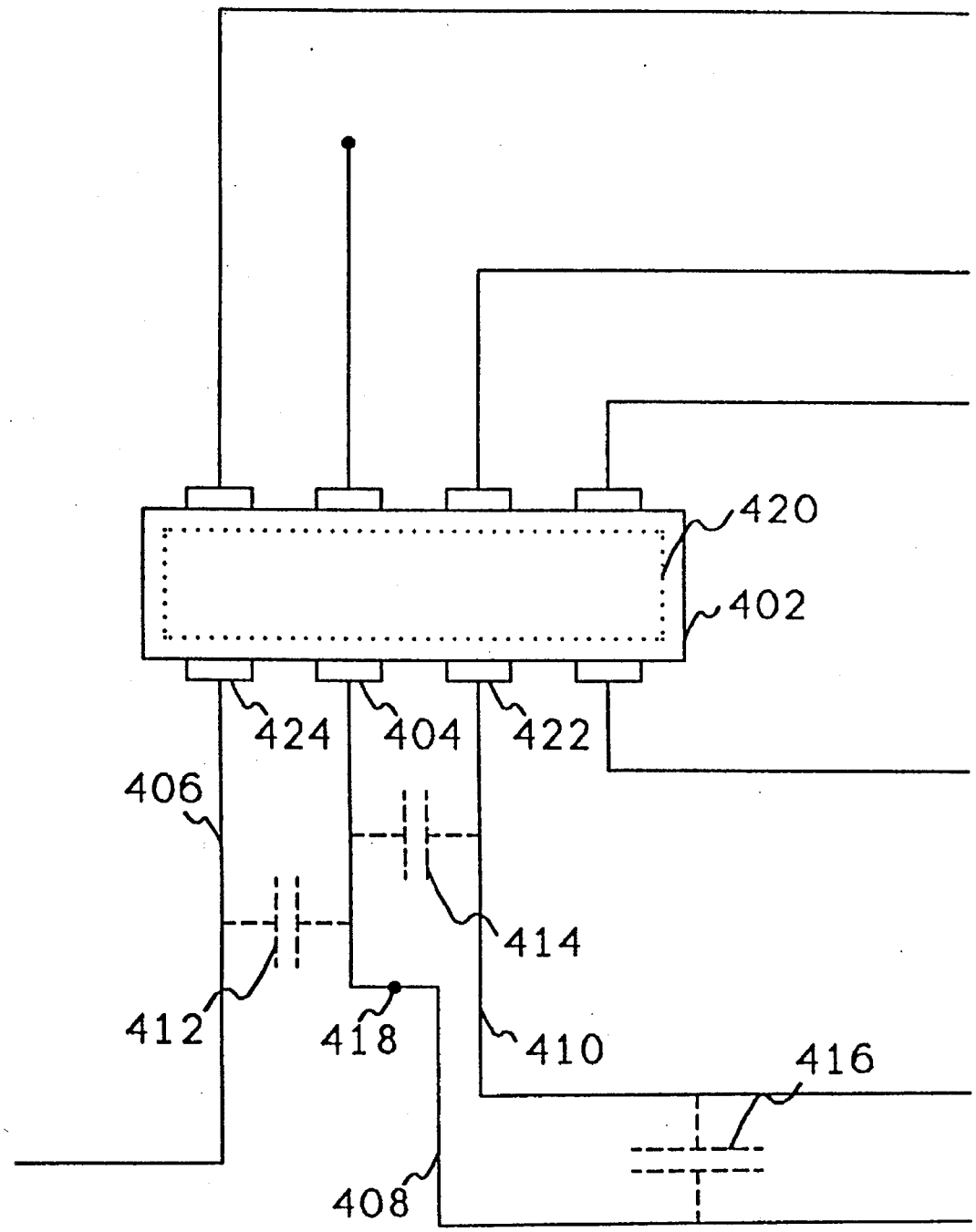
FIG. 4 shows an integrated circuit and associated printed circuit traces, and illustrates stray capacitance.

FIG. 4 shows an integrated circuit package and associated printed circuit traces that connect the lead to other circuits. An integrated circuit package 402 contains a pin 404 which is to be tested using the system of the present invention. The pin 404 is connected to a printed circuit wiring trace 408 which connects it to other components on the printed circuit board. Through a bed of nails fixture (not shown), a connection is made to the printed circuit trace 408 at a location 418. A connection is made through the bed of nails fixture between the common signal return of the oscillator 104 (FIG. 1) and a printed circuit trace 424 which is attached to a power or ground connection of the integrated circuit 402. Typically the power or ground printed circuit trace is directly connected to a ground or power plane of the printed circuit board. In other cases the power or ground circuit trace 424 is connected to the power or ground planes through a low impedance such as a capacitor or resistor (not shown). An electrode 420, here illustrated by dashed lines, is placed over the integrated circuit package 402 and connected to an ammeter (not shown in FIG. 4), as described above with respect to FIG. 1. The bed of nails fixture (not shown) connects the printed circuit trace 408 at 418 and the oscillator output. The signal on the printed circuit trace 408 is conducted to the pin 404 if a soldered connection between the trace 408 and the pin 404 has been made at the point that the pin 404 contacts the printed circuit board. The current will then flow through the capacitance between the conductor 404 inside the integrated circuit package 402 and the conductive electrode 420. The current then flows through the ammeter (not shown) and returns to the common signal return of the oscillator. The resulting current measured by the ammeter is indicative of the solder connection between the integrated circuit pin 404 and the printed circuit trace 408. A reading lower than the lower predetermined limit will be indicative of a open solder joint.

Typically the printed circuit traces on a printed circuit board will have stray capacitances associated with them. Examples of these capacitances between traces are shown in FIG. 4 with dashed lines for capacitors 412, 414 and 416. Other capacitances (not shown) are found between the printed circuit traces and the ground plane of the printed circuit board due to proximity of the traces to the ground plane which is often intentional to provide controlled impedance characteristics. Still other capacitances (not shown) are found within the integrated circuit itself, both between pins of the integrated circuit and from the connection pin of the integrated circuit to its ground (typically the substrate) connection. This ground connection is usually connected, by design, through a low impedance path to one or more conductive planes on the circuit assembly. Capacitors 412, 414, and 416, as well as capacitors internal to the integrated circuit connected from pin 424 to the pin being tested 404 and from pin 422 to the pin being tested 404, provide potential paths for the oscillator to inject capacitively into the electrode 420, thereby presenting a small capacitive reading even when the solder joint being tested is open. The above described connection between the common signal return of the oscillator and the ground or power plane of the printed circuit board allows the shunting capacitors, as well as their parallel counterparts inside the integrated circuit, to greatly attenuate the spurious oscillator signals present on pins 424 and 422 of the integrated circuit. Typical values for the capacitors 412, 416, and 414 would be around 10 pF depending on length and spacing of the traces.

In general, as many circuit assembly nodes as possible should be attached to the common signal return. Care should be taken that such nodes do not effectively "short out" the signal supplying means.

If the circuit assembly node attached to the component pin being tested is not attached to devices containing semiconductor junctions, the signal supplying means may be set to an amplitude higher than 0.2 volts RMS. This higher amplitude will result in a higher measured signal, improving the signal to noise ratio and lowering the measurement uncertainty. In other instances semiconductor junctions which turn on at lower voltage levels may be present at this node. In this case the amplitude must be lowered until the junctions are no longer turned on.

Leads should be dressed and shielded such that undesired capacitances between the signal supplying means and the measuring means are minimized. In general, the connections to the signal and measuring means should be kept as short as possible.

Limits may be determined empirically from a study of responses related to particular component package types with particular electrode configurations in a known good environment. These responses should have guard bands established to allow for measurement error and lot to lot variations in the circuit assembly and the components of the assembly.

If the design of the current measuring device is such that its input impedance is much lower, say ten times, than the impedance of any stray capacitances in parallel with it, the errors due to currents in those parallel capacitances will have a negligible effect on the measurement accuracy. An inverting operational amplifier current to voltage converter with a resistive feedback is one such implementation.

Figure 5:
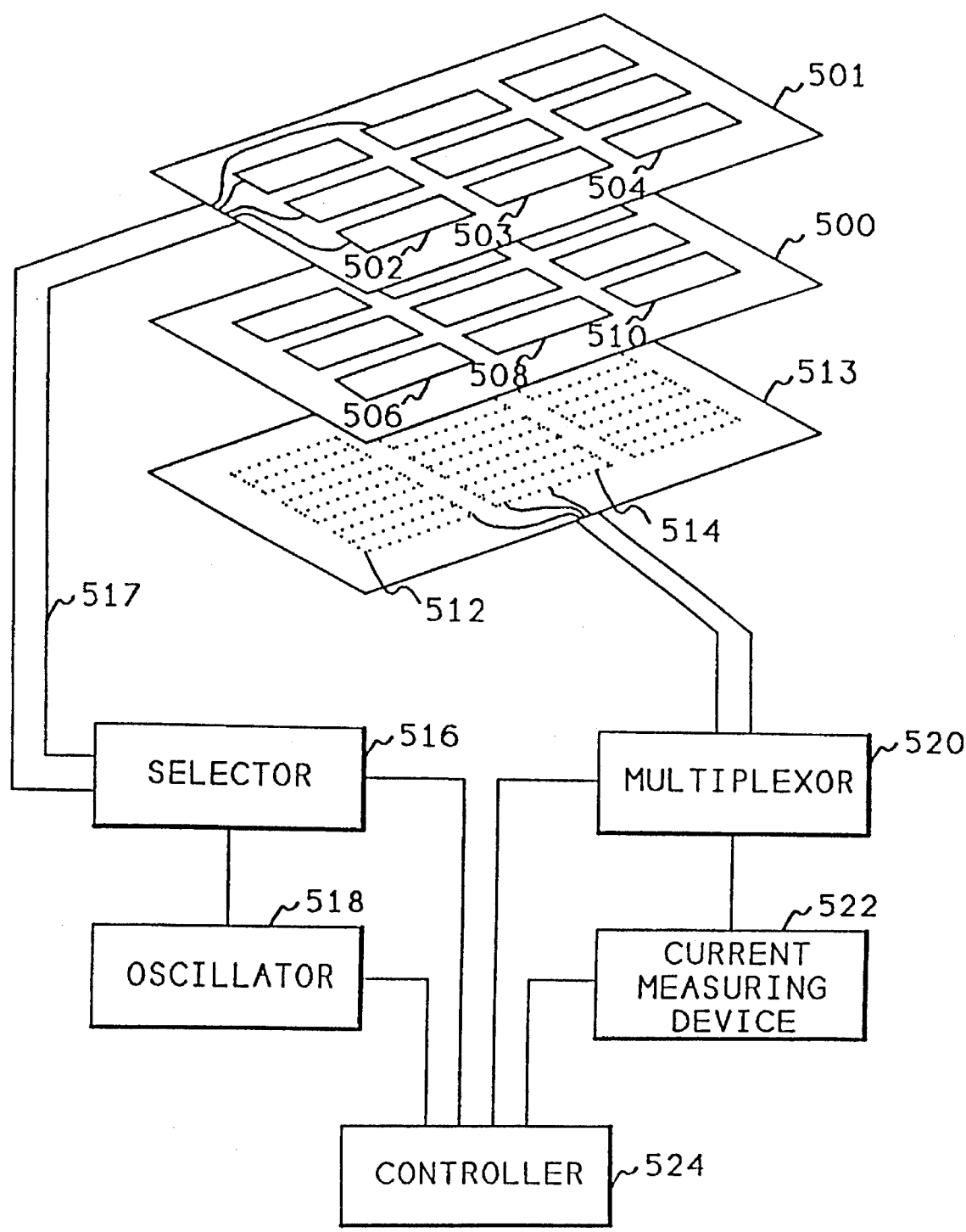
FIG. 5 shows the invention being used to test a plurality of integrated circuits on a printed circuit board.

FIG. 5 shows a diagram of the invention when used to test an entire printed circuit board. Referring now to FIG. 5, a printed circuit board 500 contains a plurality of integrated circuits 506, 508, 510, etc. A board 501, which contains a plurality of electrodes 502, 503, 504, etc., is placed over the top of the printed circuit board 500. A bed of nails tester 503, containing a plurality of probe pins 512, 514, etc., is brought into contact with the bottom of the printed circuit board 500 to connect to the printed circuit wiring traces on the printed circuit board 500. An oscillator 518 supplies a current to a selector 516. The selector 516 has a plurality of outputs, one for each of the metallic electrodes on the board 501. A cable 517, containing wires to connect to all the electrodes, connects the output of the selector to the board 501. A multiplexor 520 contains a series of inputs, one for each of the pins on the bed of nails tester 503. The output of the multiplexor is connected to a current measuring device 522. A controller 524 is connected to the oscillator 518, the selector 516, the multiplexor 520, and the current measuring device 522.

To test all the integrated circuits on the printed circuit board 500, the controller first selects one of the electrodes on the board 501 by programming the selector 516. The controller then activates the oscillator 518 to supply a current through the selector 516 to the electrode on the board 501 which is directly over the top of the integrated circuit being tested. The controller 524 then selects one of the pins from the bed of nails tester 503 by programming the multiplexor 520. The pin selected will be the pin that connects to a printed circuit board trace on the printed circuit board 500 which is connected to the particular pin of the particular integrated circuit being tested. After the multiplexor is programmed to select the correct pin, the controller activates the current measuring device 522 to determine whether the proper amount of current is present on the printed circuit board trace on the board 500. The correct amount of current is determined, as described above with respect to FIG. 4, by first determining the amount of shunt current (using a fully functional board in a separate test) that will be capacitively coupled to the trace and then determining whether the current measured exceeds the shunt current.

This process is then repeated for each pin of each integrated circuit on the board. It is important to note that this process is independent of the integrated circuit family, and easily tests TTL, CMOS, etc., and can test multiple families on the same printed circuit board.

Figure 6C:
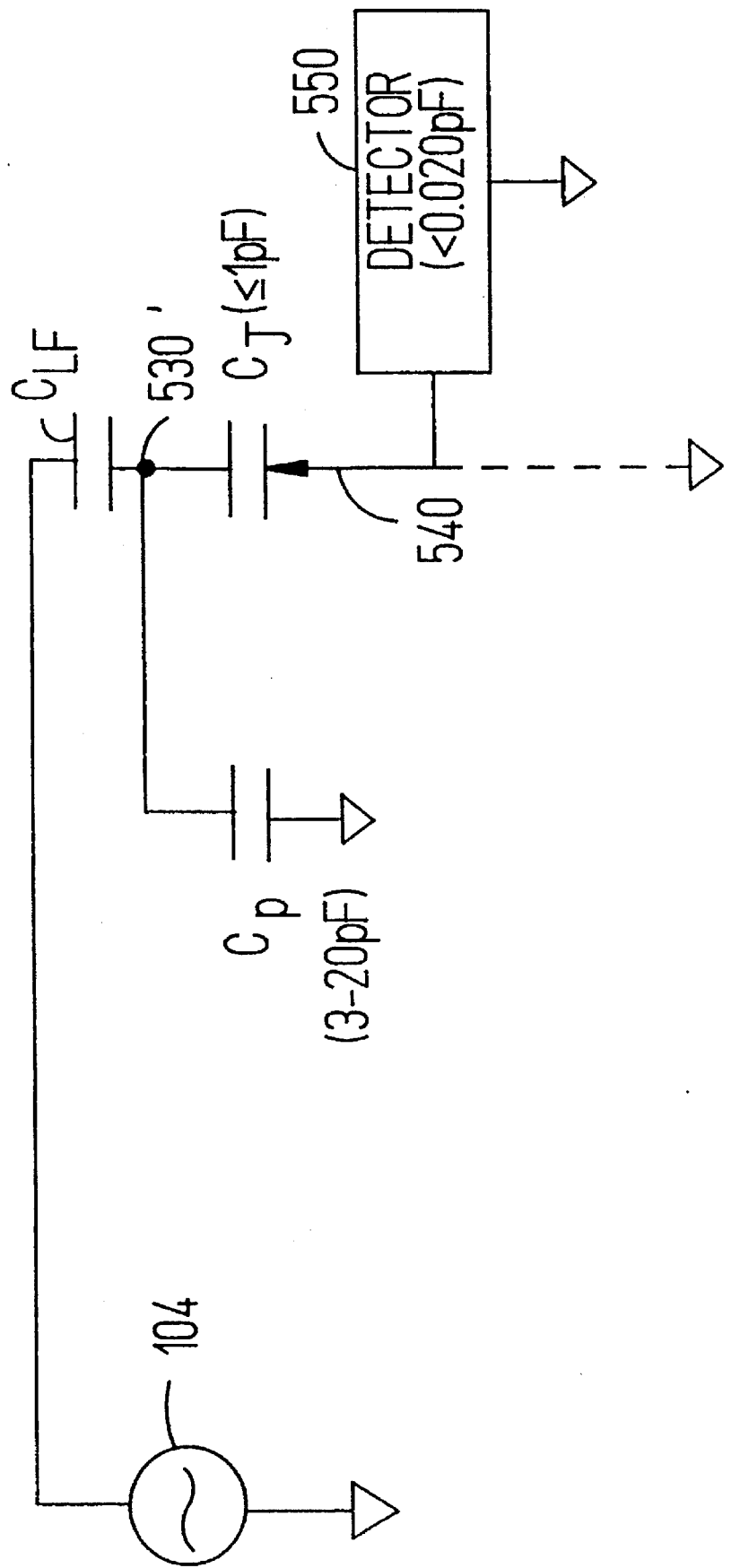
Figure 7:
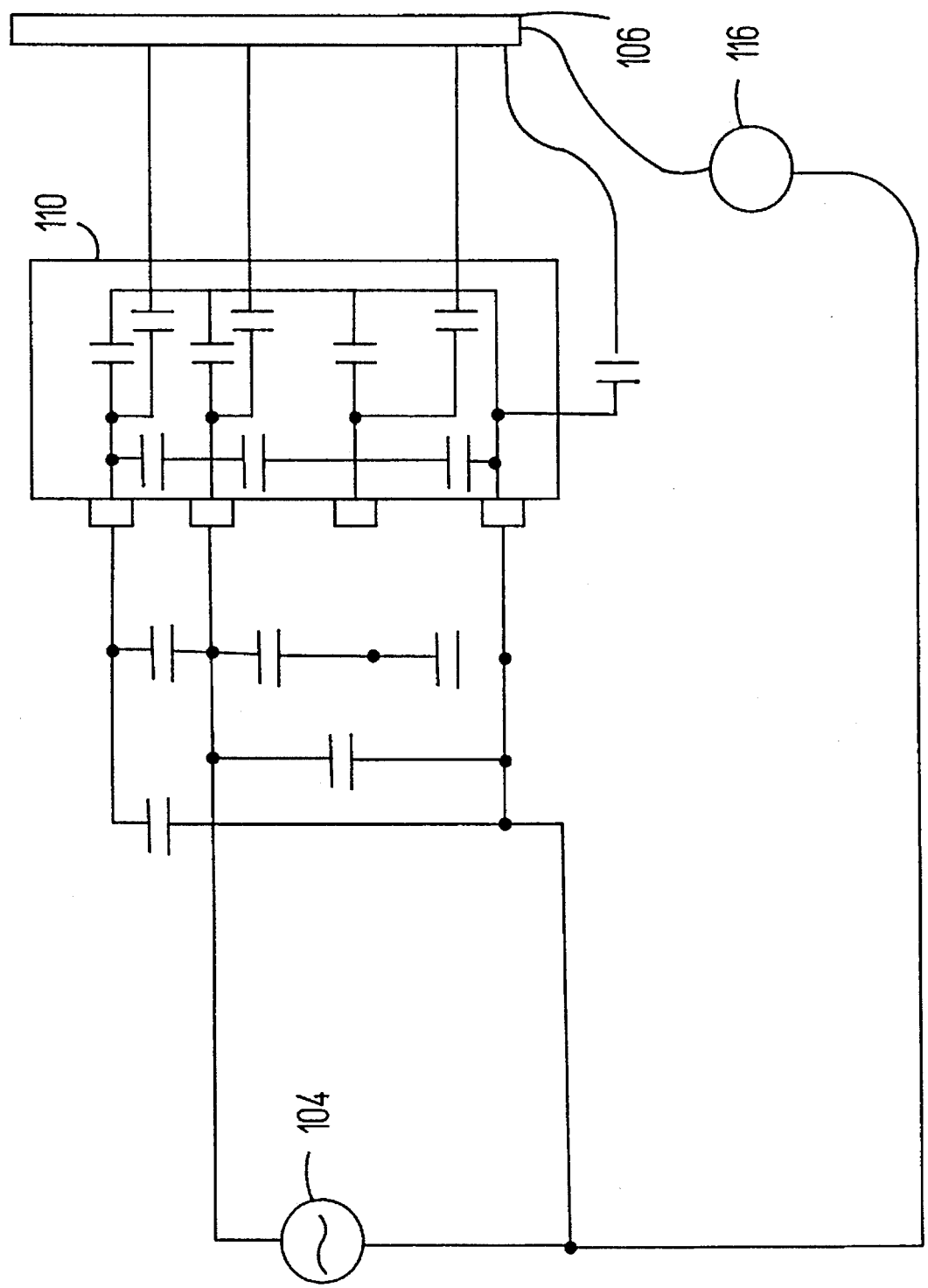
FIG. 7 shows an electrical model used to analyze one embodiment of the present invention.

FIGS. 6A through 6C will now be used to explain an important aspect of the present invention that distinguishes apparatus in accordance with the present invention from prior art apparatus that employ capacitive coupling for checking connections of an unloaded printed circuit board, for example, the apparatus disclosed by M. Rignall in U.K. Patent Application GB 2143954A, which teaches the use of capacitive coupling to test unloaded printed circuit boards for trace continuity. FIG. 6A depicts in a simplified manner the use of the present invention in checking a solder joint 530 of a pin 112 of an IC 110. A probe 540 of a current or voltage detector 550 is placed in electrical contact with a trace to which the pin 112 is soldered at solder joint 530. Detector 550 comprises a measuring operational amplifier (with feedback) and a microprocessor or other means for computing a capacitance value on the basis of the current detected at the probed point. An important feature of the detector 550 is that it holds the probed point to virtual ground (i.e., looking into the probe 540, the detector appears to have negligible impedance to ground). Alternatively, the probed point may be connected to a common return of the oscillator, or signal generator 104.

FIGS. 6B and 6C depict electrical equivalent circuits for the case in which the solder joint 530 is a "good" solder joint (FIG. 6B) and the case in which the solder joint is a "bad" solder joint (FIG. 6C). Referring now to FIG. 6B, the capacitance from the electrode 106 to the lead frame (not shown) of the IC die 110 is represented by capacitor $C_{LF}$. The parasitic capacitance from the IC die to the ground of the die is represented by capacitor $C_P$. The virtual ground (or connection to the common return of the signal generator) that appears when the detector 550 is in contact with the solder joint 530 is indicated by the broken line in FIG. 6B. Thus, a good solder joint 530 is effectively a short circuit from the probe 540 to the lead frame capacitance $C_{LF}$. The parasitic capacitance $C_P$ will typically be between 3 and 20 pF and may be as high as 200 pF, depending on the structure of the IC die 106. The capacitance measured by the detector 550, assuming a good solder joint, will typically be approximately 0.12 pF (this example assumes that all pins of the IC die 110 are grounded except for the pin whose solder joint is being measured, however this is not essential to the practice of the invention).

FIG. 6C is a schematic diagram of an electrical equivalent circuit for the case of a bad solder joint 530'. Such a bad solder joint may present a capacitance $C_J$ of up to 1 pF to the detector 550. In this case, the parasitic capacitance $C_P$ will not be virtually shorted to ground as was the case with the equivalent circuit of FIG. 6B, but instead will present a relatively low impedance path to ground for the current flowing out of the lead frame capacitance $C_{LF}$. This is because the parasitic capacitance is typically much larger than the capacitance of the bad solder joint 530'. In this situation, the detector 550 will typically measure a capacitance of less than 0.020 pF.

It has been discovered that the range of capacitance ($C_{LF}$) measured with "good" joints is approximately 0.040–0.2 pF, depending on the dielectric of the die 110 and the structure of the lead frame of the die. In connection with one embodiment of the invention, a measured capacitance of less than about 0.020 pF has been determined to be a useful threshold for indicating a bad solder joint. In addition, conventional network analysis reveals that, for a bad solder joint, the solder joint capacitance $C_J$ and threshold capacitance $C_T$ are related as follows:

$$C_J = C_T(C_{LF} + C_P)/(C_{LF} - C_T), \text{ or}$$

$$C_T = C_J C_{LF}/(C_{LF} + C_P + C_J).$$

Therefore, without the parasitic die capacitance (i.e., $C_P = 0$) and with $C_T = 0.02$ pF and $C_{LF} = 0.12$ pF, the solder joint must have a capacitance $C_J$ of less than approximately 0.024 pF. (In this case the sensitivity of the detector should be at least approximately 0.002 pF.) However, many defective surface mount solder joints have a capacitance greater than 0.024 pF. Therefore, by employing the parasitic die capacitance $C_P$ as described above, apparatus in accordance with the present invention can reliably detect bad solder joints with up to a predetermined capacitance (e.g., 1 pF), where the predetermined capacitance is a function of the parasitic capacitance of the die.

Having thus described presently preferred embodiments of the present invention, it will now be appreciated that the objects of the invention have been fully achieved, and it will be understood by those skilled in the art that many changes in construction and circuitry and widely differing embodiments and applications of the invention will suggest themselves without departing from the spirit and scope of the present invention. The disclosures and the description herein are intended to be illustrative and are not in any sense limiting of the invention, more preferably defined in scope by the following claims.

What is claimed is:

1. A system for measuring the integrity of an electrical contact between a first electrical connection pin of an electrical component and a trace of a circuit assembly, said system comprising:

(a) signal supplying means, comprising an output and a common signal return, for supplying an electrical signal via said output to said trace of the circuit assembly;

(b) an electrical connection between a second connection pin of said electrical component and said common signal return of said signal supplying means;

(c) a conductive electrode comprising a surface adapted to be placed in a fixed position in proximity to a surface of said first pin; and (d) measuring means, operatively coupled to said conductive electrode, for measuring a parameter indicative of a capacitance associated with connection of said first pin to said circuit assembly, said capacitance being indicative of the integrity of the electrical connection between said first pin and said trace of said circuit assembly.

2. The system of claim 1, further comprising error indicating means for indicating an error condition whenever said parameter is not within predetermined limits.

3. The system of claim 1, further comprising means for connecting at least one other connection pin of said electrical component to said common signal return.

4. The system of claim 1, wherein said measuring means comprises means for measuring an electrical current.

5. The system of claim 1, wherein said measuring means comprises means for measuring an electrical voltage.

6. The system of claim 1, wherein said measuring means is connected between said common signal return and said conductive electrode.

7. A system for measuring the integrity of an electrical contact between a first electrical connection pin of an electrical component and a trace of a circuit assembly, said system comprising:

(a) signal supplying means, comprising an output and a common signal return, for supplying an electrical signal via said output;

(b) an electrical connection between a second connection pin of said electrical component and said common signal return of said signal supplying means;

(c) a conductive electrode, coupled to said output of said signal supplying means, comprising a surface adapted to be placed in a fixed position in proximity to a surface of said first pin; and (d) measuring means, operatively coupled to said first pin, for measuring a parameter indicative of a capacitance associated with the connection of said first pin to said circuit assembly, said capacitance being indicative of the integrity of the electrical connection between said first pin and said trace of said circuit assembly.

8. The system of claim 7, wherein said measuring means further comprises means for holding said first pin to a virtual ground potential.

9. The system of claim 8, wherein said measuring means further comprises a measuring operational amplifier and a microprocessor, said operational amplifier comprising an input terminal adapted to receive a signal indicative of said parameter and an output terminal operatively coupled to said microprocessor, said microprocessor comprising means for computing a capacitance value on the basis of an output signal of said operational amplifier.

10. The system of claim 7, further comprising error indicating means for indicating an error condition whenever said parameter is not within predetermined limits.

11. The system of claim 7, further comprising means for connecting at least one other connection pin of said electrical component to said common signal return.

12. The system of claim 7, wherein said measuring means comprises means for measuring an electrical current.

13. The system of claim 7, wherein said measuring means comprises means for measuring an electrical voltage.

14. The system of claim 7, wherein said measuring means is connected between said common signal return and said first pin.

15. A method for measuring the integrity of an electrical contact between a first electrical connection pin of an electrical component and a trace of a circuit assembly, said method comprising:

(a) supplying an electrical signal to said trace of the circuit assembly;

(b) positioning a conductive electrode in a fixed position in proximity to a surface of said first pin;

(c) measuring a parameter indicative of a capacitance associated with connection of said first pin to said circuit assembly, said capacitance being indicative of the integrity of the electrical connection between said first pin and said trace of said circuit assembly; and (d) attenuating spurious electrical signals which may inject capacitively into the electrode through pins of said electrical component other than said first pin.

16. The method of claim 15 wherein said step of attenuating spurious electrical signals comprises electrically connecting at least one other connection pin of said electrical component to a common signal return of the signal supply.

17. The method of claim 15 further comprising the step of indicating an error condition whenever said parameter is lower than a predetermined threshold.

18. The method of claim 15 wherein the measuring step comprises measuring an electrical current.

19. The method of claim 15 wherein the measuring step comprising measuring an electrical voltage.

* * * * *